(12) United States Patent
Bennett et al.

(10) Patent No.: US 11,177,846 B2
(45) Date of Patent: Nov. 16, 2021

(54) RADIO FREQUENCY CIRCUITS AND METHODS OF PROCESSING RADIO FREQUENCY SIGNALS

(71) Applicant: BAE SYSTEMS plc, London (GB)

(72) Inventors: Mark Arwyn Bennett, Guildford (GB); Philip Charles Jarrett Pring, Guildford (GB); Roger Timothy Gaunt Gilbert, Guildford (GB)

(73) Assignee: BAE Systems plc, London (GB)

( * ) Notice: Subject to any disclaimer, the term of this patent is extended or adjusted under 35 U.S.C. 154(b) by 94 days.

(21) Appl. No.: 16/492,314

(22) PCT Filed: Mar. 9, 2018

(86) PCT No.: PCT/GB2018/050600
§ 371 (c)(1),
(2) Date: Sep. 9, 2019

(87) PCT Pub. No.: WO2018/162918
PCT Pub. Date: Sep. 13, 2018

(65) Prior Publication Data
US 2020/0412390 A1 Dec. 31, 2020

(30) Foreign Application Priority Data

Mar. 9, 2017 (EP) ..................................... 17275035
Mar. 9, 2017 (GB) ..................................... 1703754

(51) Int. Cl.
*H04L 1/00* (2006.01)
*H04B 1/04* (2006.01)
(Continued)

(52) U.S. Cl.
CPC ............. *H04B 1/0475* (2013.01); *H03B 1/04* (2013.01); *H04B 1/0017* (2013.01); *H04L 1/0071* (2013.01)

(58) Field of Classification Search
CPC ................. H04L 5/0048; H04L 5/0051; H04L 5/0007; H04L 5/0094; H04L 27/2613;
(Continued)

(56) References Cited

U.S. PATENT DOCUMENTS

| 6,621,277 | B2 * | 9/2003 | Mar ....................... G01R 23/20 324/622 |
| 2006/0064260 | A1 * | 3/2006 | Stein ...................... G01R 23/20 702/76 |
| 2007/0218854 | A1 | 9/2007 | Lawrence et al. |

(Continued)

FOREIGN PATENT DOCUMENTS

| EP | 1443640 A1 | 8/2004 |
| EP | 2120347 A1 | 11/2009 |

(Continued)

OTHER PUBLICATIONS

International Preliminary Report on Patentability received for PCT Application No. PCT/GB2018/050600. dated Sep. 19, 2019. 8 pages.

(Continued)

*Primary Examiner* — Eva Y Puente
(74) *Attorney, Agent, or Firm* — Finch & Maloney PLLC

(57) ABSTRACT

A radio frequency circuit for processing a radio frequency signal. The circuit comprises a variable frequency oscillator system and a radio frequency signal processing circuit arranged to process a radio frequency signal using the output of the variable frequency oscillator system. A digitiser is arranged to receive the output of the radio frequency signal processing circuit and generate a digitised signal. A phase noise capture circuit is arranged to capture the phase noise in the output of the variable frequency oscillator system. The radio frequency circuit is arranged to compensate for the effect of the phase noise in the output of the variable frequency oscillator system on the output of the radio
(Continued)

frequency signal processing circuit, by digitally processing the digitised signal generated by the digitiser using the output of the phase noise capture circuit.

20 Claims, 3 Drawing Sheets

(51) Int. Cl.
 *H03B 1/04* (2006.01)
 *H04B 1/00* (2006.01)

(58) Field of Classification Search
 CPC ............... H04L 5/0053; H04L 25/0226; H04L 5/0023; H04L 5/0091; H04L 1/0003; H04L 5/005; H04L 25/0204; H04W 72/042; H04W 72/04; H04W 24/10; H04W 52/146; H04W 52/325; H04W 72/0453; H04W 24/08; H04W 52/242; H04W 72/0406; H04W 72/0446; H04W 88/02; H04W 16/28; H04W 52/14; H04B 7/0626; H04B 7/0617; H04B 7/0695; H04B 7/0639; H04B 7/0456; H04B 7/0478; H04B 7/088; H04B 10/0795; H04B 10/40; H04B 7/0404; H04B 7/0413; H04B 7/0417; H04B 7/0486

USPC ...................................... 375/262; 702/76, 69
See application file for complete search history.

(56) References Cited

U.S. PATENT DOCUMENTS

2008/0097710 A1* 4/2008 Roth ...................... G01R 29/26
 702/69
2018/0254774 A1* 9/2018 Thijssen ............... H03L 7/0805

FOREIGN PATENT DOCUMENTS

| EP | 2860876 A1 | 4/2015 |
| WO | 2008116544 A1 | 10/2008 |
| WO | 2018162918 A1 | 9/2018 |

OTHER PUBLICATIONS

International Search Report and Written Opinion received for PCT Application No. PCT/GB2018/050600. dated Apr. 9, 2018. 13 pages.
GB Search Report under Section 17(5) received for GB Application No. 1703754.0 dated Aug. 31, 2017. 3 pages.
Extended European Search Report received for EP Application No. 17275035.8, dated Aug. 24, 2017. 8 pages.

\* cited by examiner

RADIO FREQUENCY CIRCUITS AND METHODS OF PROCESSING RADIO FREQUENCY SIGNALS

FIELD OF THE INVENTION

The present invention concerns radio frequency circuits and methods of processing radio frequency signals. More particularly, but not exclusively, the invention concerns radio receiver circuits, radio transmitter circuits and the like.

BACKGROUND OF THE INVENTION

In radio frequency circuits such as radio receivers and the like, a variable frequency oscillator system is often used to feed a frequency mixer or digitising component in order to process a radio frequency signal. However, variable frequency oscillator systems are prone to phase noise, which relates to the variable frequency oscillator system's short term frequency stability (i.e. fluctuation in the phase of the waveform of the oscillating signal produced by the variable frequency oscillator system). This phase noise can have a significant effect upon the operation of the radio receiver, as it is transferred to the product of the radio frequency signal and the variable frequency oscillator system (e.g. when the signals are combined by the frequency mixer).

FIG. 1 shows a circuit diagram of a part of a known radio frequency receiver circuit. The circuit comprises a mixer 4, a variable frequency oscillator system 2 and a filter 6. In operation, the variable frequency oscillator system 2 outputs an oscillating signal 3 to the mixer 4. The mixer 4 then combines the oscillating signal 3 with a received radio frequency signal 1 to generate a product signal 5. The product signal 5 is passed through a filter 6 (for example, a low pass filter) to produce a filtered signal 7, which continues to further stages 8 in the radio receiver where it is processed. In such a circuit, the oscillating signal 3 of the variable frequency oscillator system 2 is prone to phase noise, which is carried through to the product signal 5. This product signal 5 can therefore result in degraded radio performance due to the contamination of the radio frequency signal.

In order to reduce the disadvantageous effects of phase noise, high-specification components can be used to construct the variable frequency oscillator system. However, particularly at microwave and ultrahigh frequencies, such components can be very expensive and/or bulky. Techniques include the use of yttrium iron garnet (YIG) oscillators, switched banks of narrow-tuning-range oscillators, and the coherent summation of two or more oscillators.

The present invention seeks to mitigate the above-mentioned problems.

Alternatively and/or additionally, the present invention seeks to provide improved radio frequency circuits and methods of processing radio frequency signals.

SUMMARY OF THE INVENTION

In accordance with a first aspect of the invention there is provided a radio frequency circuit for processing a radio frequency signal, comprising: a variable frequency oscillator system;

a radio frequency signal processing circuit arranged to process a radio frequency signal using the output of the variable frequency oscillator system;

a digitiser arranged to receive the output of the radio frequency signal processing circuit and generate a digitised signal;

a phase noise capture circuit arranged to capture the phase noise in the output of the variable frequency oscillator system;

wherein the radio frequency circuit is arranged to compensate for the effect of the phase noise in the output of the variable frequency oscillator system on the output of the radio frequency signal processing circuit, by digitally processing the digitised signal generated by the digitiser using the output of the phase noise capture circuit.

By using a digitiser to generate a digitised signal from the output of the radio frequency signal processing circuit, the processing of the output radio frequency signal can be done digitally, using any desired digital processing method. Further, by capturing the phase noise in the output of the variable frequency oscillator system and using this when digitally processing the digitised signal, the digital processing can be done to compensate for the effect of the phase noise. In this way, rather than minimising the phase noise present in the variable frequency oscillator system signal, which can require the use of expensive and/or bulky components, a "lower quality" variable frequency oscillator system can be used in which phase noise is present, and then any disadvantageous effects on the output radio frequency signal due to that phase noise can be removed (or at least mitigated) by the digital processing. Further, such digital processing method can be as complicated as desired in order to achieve the best possible result, without expensive and/or bulky components being required digitisers are commonly used for many applications and so are easily and cheaply available.

Preferably, the phase noise capture circuit comprises a fixed frequency oscillator. Fixed frequency oscillators are available that can generate an oscillating signal with very little phase noise, without expensive and/or bulky components being required. In the case the phase noise capture circuit comprises a fixed frequency oscillator, the variable frequency oscillator system may be arranged to use the output of the fixed frequency oscillator. The variable frequency oscillator system may use the output of the fixed frequency oscillator as a reference to generate the variable frequency signal, for example. Similarly, the digitiser may be arranged to receive the output of the fixed frequency oscillator. The digitiser may use the output of the fixed frequency oscillator to generate its sampling clock, for example.

When the phase noise capture circuit comprises a fixed frequency oscillator, the phase noise capture circuit may further comprise: a comb generator arranged to receive the output of the fixed frequency oscillator and generate a signal comprising harmonics of the output of the fixed frequency oscillator; a mixer arranged to mix the output of the comb generator with the output of the variable frequency oscillator system; and a low pass filter arranged to filter the output of the mixer. In this way, the phase noise is transferred to a low frequency signal, as the low pass filter will only pass the part of the output of the mixer that is generated by subtracting from the variable frequency oscillator system signal the closest harmonic of the fixed frequency oscillator signal from the comb generator, so that it is lower than the threshold of the low pass filter.

Alternatively, the phase noise capture circuit may be arranged to measure the phase noise in the output of the variable frequency oscillator system.

The circuit may further comprise a second digitiser arranged to receive the output of the phase noise capture circuit and generate a digitised signal.

Advantageously, the circuit is a radio receiver circuit. In this case, the radio receiver circuit may be a superheterodyne receiver circuit. Alternatively, the circuit is a radio transmitter circuit. However, it will be appreciated that the circuit could be any other type of radio frequency circuit. The radio frequency signal processing circuit may be the whole of the circuit, or only a part thereof with other processing stages following the digital processing to compensate for the effect of the phase noise.

The radio frequency signal may be a microwave frequency signal.

In accordance with a second aspect of the invention there is provided a method of processing a radio frequency signal, comprising the steps of:

processing a radio frequency signal using the output of a variable frequency oscillator system;

generating a digitised signal from the processed radio frequency signal, using a digitiser;

capturing the phase noise in the output of the variable frequency oscillator system;

digitally processing the digitised signal generated by the digitiser to compensate for the effect of the phase noise in the output of the variable frequency oscillator system, using the captured phase noise.

Preferably, the phase noise is captured using a fixed frequency oscillator signal. In this case, the variable frequency oscillator system may use the fixed frequency oscillator signal. Similarly, the fixed frequency oscillator signal may be used to generating the digitised signal from the processed radio frequency signal. Capturing the phase noise may comprise the steps of:

generating from the fixed frequency oscillator signal a signal comprising harmonics of the fixed frequency oscillator signal;

mixing the generated signal with the output of the variable frequency oscillator system; and filtering the mixed signal using a low pass filter.

Alternatively, capturing the phase noise may comprise measuring the phase noise.

The method may further comprise the step of generating a digitised signal from the captured phase noise, using a second digitiser.

The radio frequency signal may be a microwave frequency signal.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which.

DETAILED DESCRIPTION

Figure 1:
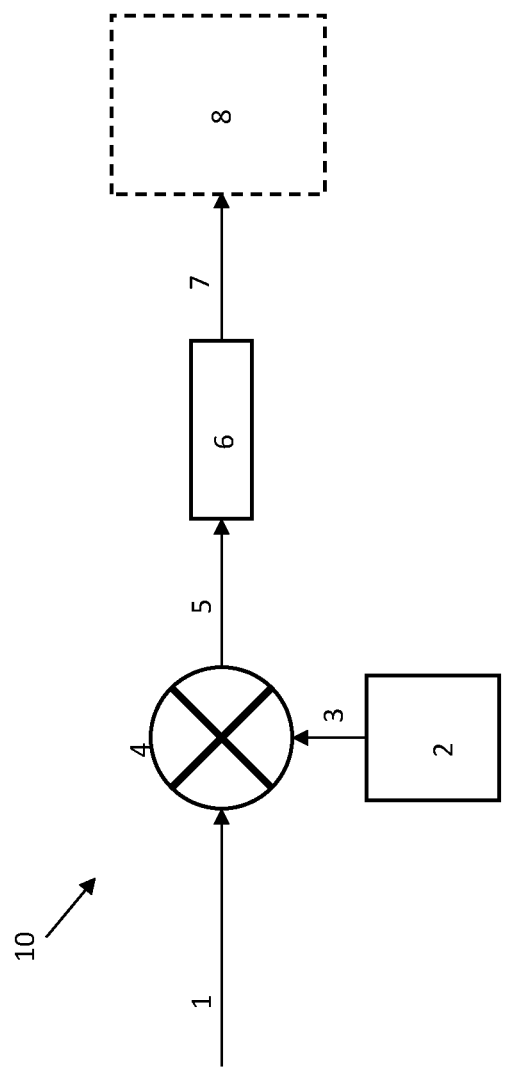
FIG. 1 is a circuit diagram of a part of a known radio frequency receiver circuit.
Figure 2:
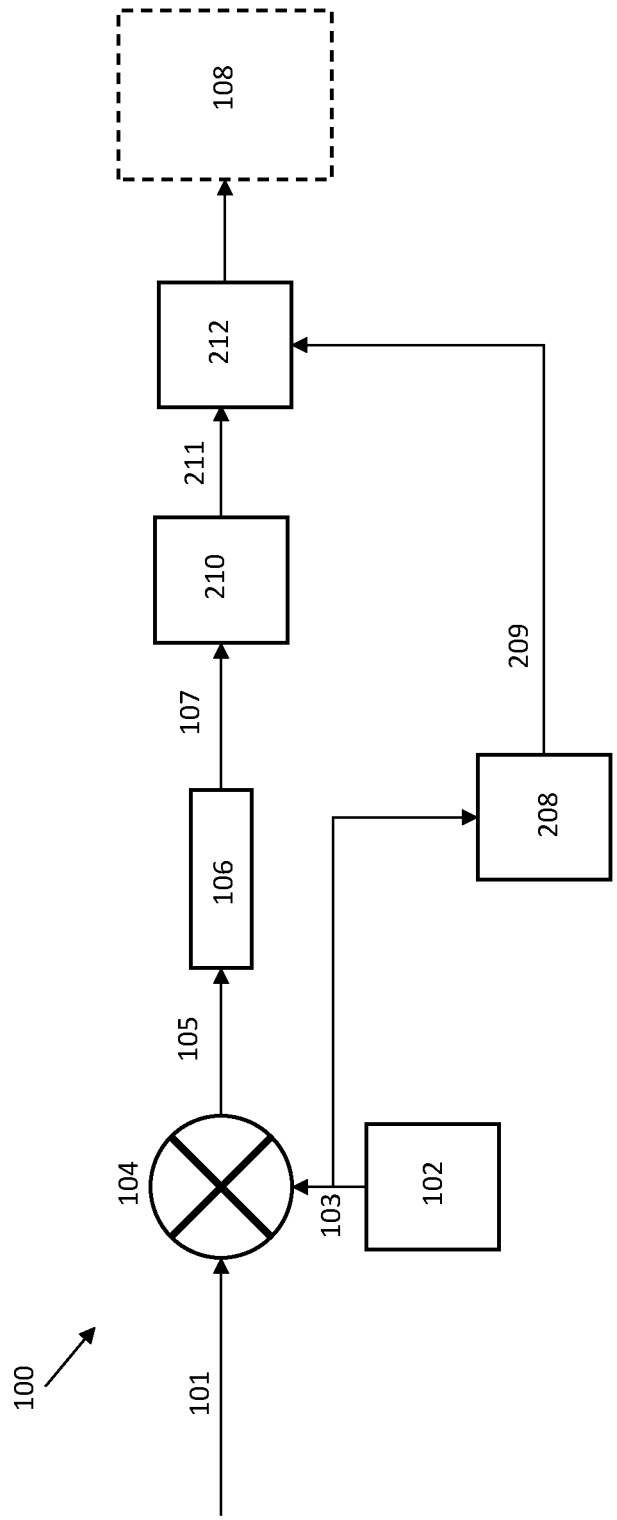
FIG. 2 is a circuit diagram of a part of a radio frequency receiver circuit according to an embodiment of the invention.

FIG. 2 is a circuit diagram of a part of a radio frequency receiver circuit in accordance with an embodiment of the invention. As in the known radio frequency receiver circuit 10 of FIG. 1, the radio frequency receiver circuit 100 comprises a mixer 104, a variable frequency oscillator system 102 and a filter 106. In operation, the variable frequency oscillator system 102 again outputs an oscillating signal 103 to the mixer 104. The mixer 104 combines the oscillating signal 103 with a received radio frequency signal 101 to again generate a product signal 105. The product signal 105 is passed through a filter 106 (configured to perform desirable filtering, for example a low pass filter), to produce a filtered signal 107.

The filtered signal 107 is then passed to an analogue to digital converter 210, which converts it into a digitised signal 211.

The radio frequency receiver circuit 100 further comprises a phase noise capture circuit 208. The oscillating signal 103 of the variable frequency oscillator system 102 is also passed to the phase noise capture circuit 208. The phase noise capture circuit 208 measures the phase noise in the oscillating signal 103, and generates a phase noise signal 209 indicative of the phase noise in the oscillating signal 103.

Within the phase noise capture circuit 208, the oscillating signal 103 or a derivative of the oscillating signal bearing the same phase noise as the oscillating signal is digitised and then digitally processed to determine the phase noise in the oscillating signal 103, and the phase noise capture circuit then generates a digital signal indicative of the phase noise as the phase noise signal 209.

The phase noise of a digitised signal can be determined by comparing the digitised signal with a numerical oscillator of the same frequency to produce a phase correction signal that can be used to compensate phase errors in other signals introduced by mixing with the original oscillating signal.

In another embodiment of the phase noise capture circuit 208, the phase noise could be measured by analogue means. In yet another embodiment described in more detail below, rather than explicitly measuring the phase noise the phase noise capture circuit transfers it to a low frequency signal bearing the same phase noise as the oscillating signal.

Both the digitised signal 211 and phase noise signal 209 are passed to a phase noise compensation circuit 212. The phase noise compensation circuit 212 digitally processes the digitised signal 211, using the information provided by the phase noise signal 209, to compensate for any undesirable effects of the phase noise.

It will be appreciated that as the digitised signal 211 is being processed digitally, very complicated techniques could be used, individually or together, without complicated and/or circuitry being required.

In another embodiment the phase noise compensation circuit 212 has a calibration phase where the circuit is fed test signals, to allow the effects of phase noise and how they could be compensated for to be determined.

As in the circuit 10, following the digitised signal 211 being digitally processed to compensate for the effects of phase noise, it continues to further stages 108 of the circuit 100.

Figure 3:
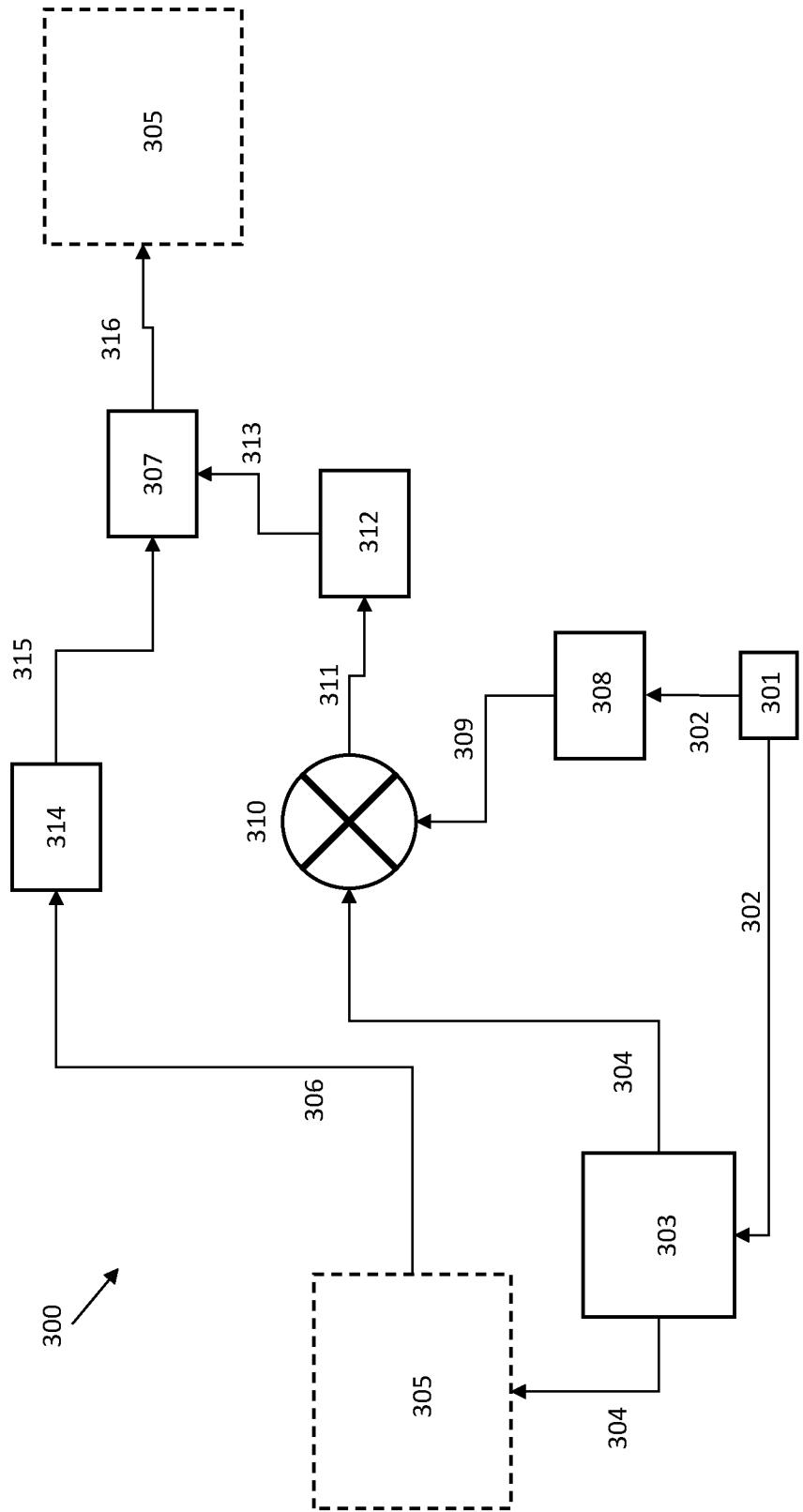
FIG. 3 is a circuit diagram of a part of a radio frequency circuit including a phase noise capture circuit according to another embodiment of the invention.

FIG. 3 is a circuit diagram of a part of radio frequency receiver circuit including a phase noise capture circuit according to yet another embodiment of the invention. The radio frequency receiver circuit 300 comprises a fixed frequency oscillator 301, which generates a fixed frequency oscillating signal 302. The fixed frequency oscillator 301 may for example be a crystal oscillator, producing a signal at 100 MHz for example. Because only a fixed frequency oscillating signal is required, the fixed frequency oscillator 301 is able to generate an oscillating signal with very little phase noise, without expensive and/or bulky components being required.

The fixed frequency oscillating signal 302 is passed to a variable frequency oscillator system circuit 303, which uses it to generate an oscillating signal 304 at the required frequency for a part 305 of the radio frequency receiver circuit 300 proper, for example an initial receiver stage that initially receives and processes the input radio frequency signal. As discussed above, the oscillating signal 304 from the variable frequency oscillator system circuit 303 will be prone to phase noise.

The oscillating signal 304 is then passed to radio receiver circuitry 305, which uses it as required to generate an output signal 306. For example, the radio receiver circuitry 305 may be the initial stage of a superhet receiver circuit, which takes an input radio frequency signal and generates an intermediate frequency signal as the output signal 306. The output signal 306 is then passed to an analogue to digital converter 210, which converts it into a digitised signal 315. The digitised signal 315 is then passed to a phase noise compensation circuit 307, which is discussed in more detail below.

The radio frequency receiver circuit 300 also comprises a comb generator 308, which also receives the fixed frequency oscillating signal 302 from the fixed frequency oscillator 301. The comb generator 308 may for example comprise an amplifier and a fast non-linear device such as a step-recovery diode, though it will be appreciated that many ways of providing a comb generator will be known. The comb generator 308 generates a comb signal 309 comprising harmonics of the fixed frequency oscillating signal 302 (the harmonics providing the spikes in the "comb" seen in the frequency graph of the comb signal 309 generated by the comb generator 308). In other embodiments, other types of high-speed impulse generators may be used.

The comb signal 309 from the comb generator 308 and the oscillating signal 304 from the variable frequency oscillator system 303 are then mixed by a frequency mixer 310, to produce a product signal 311. In other embodiments, a sampling gate may be used. The product signal 311 is then passed to a low pass filter 312, which filters the product signal 311 to produce a filtered signal 313. In particular, the low pass filter 312 filters the product signal 311 so that the only part of the product signal 311 that remains is that produced by the oscillating signal 304 from which the closest frequency harmonic of the comb signal 309 has been subtracted. (This is because the addition or negation of any other harmonics will result in a higher frequency signal, as the other harmonics are further away in frequency from the frequency of the oscillating signal 304, and then those higher frequency signal will be filtered out by the low pass filter 312.) In this way, the filtered signal 313 comprises the phase noise in the oscillating signal 304 transferred to a low frequency signal. Thus, the fixed frequency oscillator 301, comb generator 308, frequency mixer 310 and low pass filter 312 provide a phase noise capture circuit that captures the phase noise in the oscillating signal 304.

The filtered signal 313 is then passed to the phase noise compensation circuit 307, which uses the filtered signal 313 converted to a digital signal by an analogue to digital convertor (not shown) to digitally process the digitised signal 315 produced by digitising the output signal 307 from the radio receiver circuitry 305, to compensate for any undesirable effects of the phase noise. The compensation is done using the filtered signal 313 in which the phase noise in the oscillating signal 304 has been captured. As with the previous embodiment, this compensation could be done using various different techniques, either alone or in combination, and may involve the filtered signal 313 also being digitised.

Similarly to the previous embodiment, following the digitised signal 315 being digitally processed to compensate for the effects of phase noise, it is passed to further stages 305 of the circuit 300.

In order to apply digital phase correction the skilled person may convert the digitised signal 315 to a complex (real and imaginary) format and then use vector rotation to apply a counteracting phase shift in accordance with the phase of the product signal 311 to the digitised signal 315.

While the present invention has been described and illustrated with reference to particular embodiments, it will be appreciated by those of ordinary skill in the art that the invention lends itself to many different variations not specifically illustrated herein.

While the above-described embodiments are radio frequency receiver circuits, it will be appreciated that the invention could be applied to other types of radio frequency circuits that use an oscillating signal that includes phase noise, for example a radio frequency transmitter circuit.

The extraction of the phase noise from the oscillating signal requires a delay in processing. This is not a problem in a digital receiver, as there is also a delay in the receiver processing. It can be ensured that the measured noise is used to compensate the correct part of the received signal by equalising the delays, which is easily done in digitised signals. In other types of circuit such as a transmitter, it again is necessary to ensure that the measured noise is used to correct the correct part of circuit signal. In a transmitter this may be done, for example, by delaying the oscillating signal from the variable frequency oscillator system after the phase noise has been captured but before it is mixed with a signal.

It will also be appreciated that the compensation to remove the effects of phase noise could be performed at different stages in a circuit, including after a first stage of a circuit after the oscillating signal has been used but when there are later processing stages, or after any of those later processing stages, or the compensation could be performed on the final output of the circuit after all stages of processing had occurred.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A radio frequency circuit for processing a radio frequency signal, comprising:
   a variable frequency oscillator system having an output;
   a radio frequency signal processing circuit having an output and arranged to process a radio frequency signal using the output of the variable frequency oscillator system;
   a digitiser arranged to receive the output of the radio frequency signal processing circuit and generate a digitised signal; and
   a phase noise capture circuit having a digitised output and arranged to capture phase noise in the output of the variable frequency oscillator system, wherein the phase noise capture circuit comprises a fixed frequency oscillator having an output;
   wherein the radio frequency circuit is arranged to compensate for the effect of the phase noise in the output of the variable frequency oscillator system on the output of the radio frequency signal processing circuit, by digitally processing the digitised signal generated by the digitiser using the digitised output of the phase noise capture circuit.

2. The radio frequency circuit as claimed in claim 1, wherein the variable frequency oscillator system is arranged to use the output of the fixed frequency oscillator.

3. The radio frequency circuit as claimed in claim 1, wherein the digitiser is arranged to receive the output of the fixed frequency oscillator.

4. The radio frequency circuit as claimed in claim 1, wherein the phase noise capture circuit further comprises:
   a comb generator arranged to receive the output of the fixed frequency oscillator and generate a signal comprising harmonics of the output of the fixed frequency oscillator;
   a mixer having an output and arranged to mix the output of the comb generator with the output of the variable frequency oscillator system; and
   a low pass filter arranged to filter the output of the mixer.

5. The radio frequency circuit as claimed in claim 1, wherein the phase noise capture circuit is arranged to measure the phase noise in the output of the variable frequency oscillator system.

6. The radio frequency circuit as claimed in claim 1, further comprising a second digitiser arranged to generate the digitised output of the phase noise capture circuit.

7. The radio frequency circuit as claimed in claim 1, wherein the radio frequency circuit is a radio receiver circuit.

8. A method of processing a radio frequency signal, comprising:
   processing a radio frequency signal using an output of a variable frequency oscillator system;
   generating a digitised signal from the processed radio frequency signal, using a digitiser;
   capturing phase noise, using a fixed frequency oscillator signal, in the output of the variable frequency oscillator system;
   generating a digitised signal from the captured phase noise, using a second digitiser;
   digitally processing the digitised signal from the processed radio frequency signal using the digitised signal from the captured phase noise to compensate for the effect of the phase noise in the output of the variable frequency oscillator system.

9. The method as claimed in claim 8, wherein the variable frequency oscillator system uses the fixed frequency oscillator signal.

10. The method as claimed in claim 8, wherein the fixed frequency oscillator signal is used to generate the digitised signal from the processed radio frequency signal.

11. The method as claimed in claim 8, wherein capturing the phase noise comprises:
    generating from the fixed frequency oscillator signal a signal comprising harmonics of the fixed frequency oscillator signal;
    mixing the generated signal with the output of the variable frequency oscillator system; and
    filtering the mixed signal using a low pass filter.

12. The method as claimed in claim 8, wherein capturing the phase noise comprises measuring the phase noise.

13. A radio frequency (RF) circuit for processing an RF signal, comprising:
    a variable frequency oscillator having an output;
    an RF signal processing circuit having an output and arranged to process an RF signal using the output of the variable frequency oscillator system;
    a first analog-to-digital conversion circuit arranged to receive the output of the RF signal processing circuit and generate a first digitised signal; and
    a phase noise capture circuit having an output and arranged to measure phase noise in the output of the variable frequency oscillator system, the wherein the phase noise capture circuit includes
       a fixed frequency oscillator having an output that is provided to the variable frequency oscillator system;
       a comb generator arranged to receive the output of the fixed frequency oscillator and generate a signal comprising harmonics of the output of the fixed frequency oscillator;
       a mixer having an output and arranged to mix the output of the comb generator with the output of the variable frequency oscillator system; and
       a low pass filter having an output and arranged to filter the output of the mixer;
    a phase noise compensation circuit including or operatively coupled to a second analog-to-digital conversion circuit, the second analog-to-digital conversion circuit to convert the output of the low pass filter to a second digitised signal, the phase noise compensation circuit arranged to use the second digitized signal to digitally process the first digitised signal to compensate for the phase noise.

14. The RF circuit as claimed in claim 13, wherein the RF circuit is a radio receiver circuit.

15. The RF circuit as claimed in claim 13, wherein the RF signal processing circuit includes front-end circuitry of an RF receiver circuit.

16. The RF circuit as claimed in claim 13, wherein the RF circuit is included in a superheterodyne receiver.

17. An RF receiver including the RF circuit as claimed in claim 13.

18. The radio frequency circuit as claimed in claim 1, wherein the radio frequency circuit is included in a superheterodyne receiver.

19. The radio frequency circuit as claimed in claim 1, wherein the radio frequency circuit is a radio transmitter circuit.

20. The method as claimed in claim 8, wherein digitally processing the digitised signal from the processed radio frequency signal using the digitised signal from the captured phase noise is performed by a phase noise compensation circuit, and the method further comprises calibrating the phase noise compensation circuit based on test signals fed to the phase noise compensation circuit.

\* \* \* \* \*